(12) United States Patent
Thorum et al.

(10) Patent No.: US 10,825,686 B2
(45) Date of Patent: *Nov. 3, 2020

(54) HYDROSILYLATION IN SEMICONDUCTOR PROCESSING

(71) Applicant: Micron Technology, Inc., Boise, ID (US)

(72) Inventors: Matthew S. Thorum, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/676,793

(22) Filed: Nov. 7, 2019

(65) Prior Publication Data
US 2020/0075340 A1      Mar. 5, 2020

Related U.S. Application Data

(63) Continuation of application No. 15/847,540, filed on Dec. 19, 2017, now Pat. No. 10,475,656.

(51) Int. Cl.
| | | |
|---|---|---|
| *H01L 21/322* | (2006.01) | |
| *H01L 21/30* | (2006.01) | |
| *H01L 21/67* | (2006.01) | |
| *H01L 21/02* | (2006.01) | |

(52) U.S. Cl.
CPC .... *H01L 21/3003* (2013.01); *H01L 21/02057* (2013.01); *H01L 21/67023* (2013.01); *H01L 21/67028* (2013.01)

(58) Field of Classification Search
CPC ........... H01L 21/3003; H01L 21/67023; H01L 21/67028; H01L 21/02057

USPC ........................................................ 438/471
See application file for complete search history.

(56) References Cited

U.S. PATENT DOCUMENTS

| | | | | |
|---|---|---|---|---|
| 5,429,708 | A * | 7/1995 | Linford | B05D 1/185 216/66 |
| 7,749,909 | B2 | 7/2010 | Tomita et al. | |
| 8,617,993 | B2 | 12/2013 | Yasseri et al. | |
| 9,618,839 | B2 * | 4/2017 | Ibn-Elhaj | B82Y 40/00 |
| 9,653,307 | B1 | 5/2017 | Imonigie et al. | |
| 10,475,656 | B2 * | 11/2019 | Thorum | H01L 21/3003 |

(Continued)

FOREIGN PATENT DOCUMENTS

| | | |
|---|---|---|
| JP | 2017-050576 A | 3/2017 |
| KR | 10-2014-0029095 A | 3/2014 |

OTHER PUBLICATIONS

Linford, Alkyl Monolayers on Silicon Prepared from 1-Alkenes and Hydrogen-Terminated Silicon, J. Am. Chem. Soc. 1995, 117, 3145-3155) (Year: 1995).*

(Continued)

*Primary Examiner* — Vu A Vu
(74) *Attorney, Agent, or Firm* — Brooks, Cameron & Huebsch, PLLC

(57) ABSTRACT

An example of forming semiconductor devices can include forming a silicon-hydrogen (Si—H) terminated surface on a silicon structure that includes patterned features by exposing the silicon structure to a hydrogen fluoride (HF) containing solution and performing a surface modification via hydrosilylation by exposing the Si—H terminated surface to an alkene and/or an alkyne.

20 Claims, 4 Drawing Sheets

(56) References Cited

U.S. PATENT DOCUMENTS

| | | | |
|---|---|---|---|
| 2003/0008238 A1* | 1/2003 | Goldfarb | F26B 5/005 |
| | | | 430/272.1 |
| 2004/0096893 A1* | 5/2004 | Boukherroub | C07H 15/26 |
| | | | 506/32 |
| 2009/0082222 A1* | 3/2009 | Cai | B82Y 30/00 |
| | | | 506/16 |
| 2011/0139083 A1 | 6/2011 | Krone et al. | |
| 2011/0189858 A1 | 8/2011 | Yasseri et al. | |
| 2011/0275734 A1 | 11/2011 | Scales | |
| 2012/0015501 A1 | 1/2012 | Tu | |
| 2013/0081301 A1 | 4/2013 | Gouk et al. | |
| 2013/0281713 A1* | 10/2013 | Willson | C07F 7/0874 |
| | | | 549/215 |
| 2014/0227548 A1* | 8/2014 | Myrick | C06B 45/30 |
| | | | 428/570 |
| 2015/0118821 A1 | 4/2015 | Millward et al. | |
| 2015/0128991 A1 | 5/2015 | Brown et al. | |
| 2015/0228883 A1 | 8/2015 | Boukai | |
| 2016/0002272 A1* | 1/2016 | Wu | A61K 9/0051 |
| | | | 424/427 |
| 2016/0042945 A1 | 2/2016 | Limary et al. | |
| 2016/0097590 A1 | 4/2016 | Sirard et al. | |
| 2017/0250094 A1 | 8/2017 | Verhaverbeke et al. | |
| 2017/0341106 A1 | 11/2017 | Bang | |
| 2018/0233363 A1 | 8/2018 | Glodde | |

OTHER PUBLICATIONS

Buriak "Organometallic Chemistry on Silicon and Germanium Surfaces", Chemical Reviews, vol. 102, No. 5, Mar. 8, 2002, pp. 1271-1308.

Chen, et al. "Non-Stiction Performance of Various Post Wet-Clean Drying Schemes on High-Aspect-Ratio Device Structures", the Electrochemical Society, vol. 58, Issue 6, 2013, 1 pp.

International Search Report and Written Opinion from related international application No. PCT/US2018/065117, dated Apr. 25, 2019, 12 pages.

Matthew R. Linford, "Alkyl Monolayers on Silicon Prepared from 1-Alkenes and Hydrogen-Terminated Silicon", J. Am. Chem. Soc. 1995, 117, 3145-3155 (Year: 1995).

Office Action and Search Report from related Taiwan patent application No. 107145866, dated Mar. 27, 2020, 16 pages.

* cited by examiner

HYDROSILYLATION IN SEMICONDUCTOR PROCESSING

PRIORITY INFORMATION

This application is a Continuation of U.S. application Ser. No. 15/847,540, filed on Dec. 19, 2017, the contents of which are incorporated herein by reference.

TECHNICAL FIELD

The present disclosure relates generally to semiconductor processing, and, more particularly, to using hydrosilylation in semiconductor processing.

BACKGROUND

Semiconductor processing (e.g., fabrication) can be used to form semiconductor devices, such as integrated circuits, memory devices, microelectromechanical devices (MEMS), etc.

Examples of memory devices that can be formed by semiconductor processing include, but are not limited to, volatile memory (e.g., that can require power to maintain its data), such as random-access memory (RAM), dynamic random access memory (DRAM), synchronous dynamic random access memory (SDRAM), among others, and non-volatile memory (e.g., that can provide persistent data by retaining stored data when not powered), such as NAND flash memory, NOR flash memory, read only memory (ROM), electrically erasable programmable ROM (EEPROM), erasable programmable ROM (EPROM, among others.

Semiconductor processing can involve forming features (e.g., patterns) on and/or in a semiconductor (e.g., of silicon) that may be referred to as a wafer or substrate. In some examples, one or more materials, such as silicon-based materials (e.g., silicon oxide (SiO), silicon nitride (SiN), tetraethyl orthosilicate (TEOS), and/or polysilicon) may be formed on the semiconductor. For instance, a deposition process, such as physical vapor deposition (PVD), chemical vapor deposition (CVD), atomic layer deposition (ALD), electrochemical deposition and/or molecular beam epitaxy, among others may be used to form one or more materials on the semiconductor.

Subsequently, portions of the one or more materials, and in some instances, portions of the semiconductor, may be removed, such as by wet and/or dry etching, to form the features. In some examples, the features may have high aspect ratios (e.g., ratio of height to width or diameter) and may be referred to as high-aspect-ratio (HAR) features. For example, the features might be separated from each other by HAR openings.

During processing, the semiconductor and the features may be subjected to wet processing, such as wet cleaning, and subsequent drying. For example, wet cleaning can be helpful to remove residue left behind, such as by the removal process or other processing.

DETAILED DESCRIPTION

The present disclosure includes processing methods associated with forming semiconductor devices, such as integrated circuits, memory devices MEMS, among others. An example of forming semiconductor devices can include forming a silicon-hydrogen (Si—H) terminated surface on a silicon structure that includes patterned features by exposing the silicon structure to a hydrogen fluoride (HF) containing solution and performing a surface modification via hydrosilylation by exposing the Si—H terminated surface to an alkene and/or an alkyne.

Embodiments of the present disclosure provide technical advantages, such as reducing the likelihood of feature collapse (e.g. toppling) and stiction between features during processing compared to previous approaches. For instance, a number of embodiments perform a hydrosilylation surface modification process, that acts to prevent feature collapse (e.g., sometimes referred to as pattern collapse) by altering the contact angle of liquids on the silicon structure to reduce capillary pressure between features and/or reduce stiction between features.

Some prior approaches can include performing surface modification using silanes that react with surface OH groups. These prior approaches are not effective at preventing feature collapse and/or reducing stiction on structures that include features with aspect ratios of 10 to 1 or greater. The prior approaches also can include oxidizing the surface so the silane can react and modify the surface, which results in material loss when oxidizing the surface.

Figure 1:
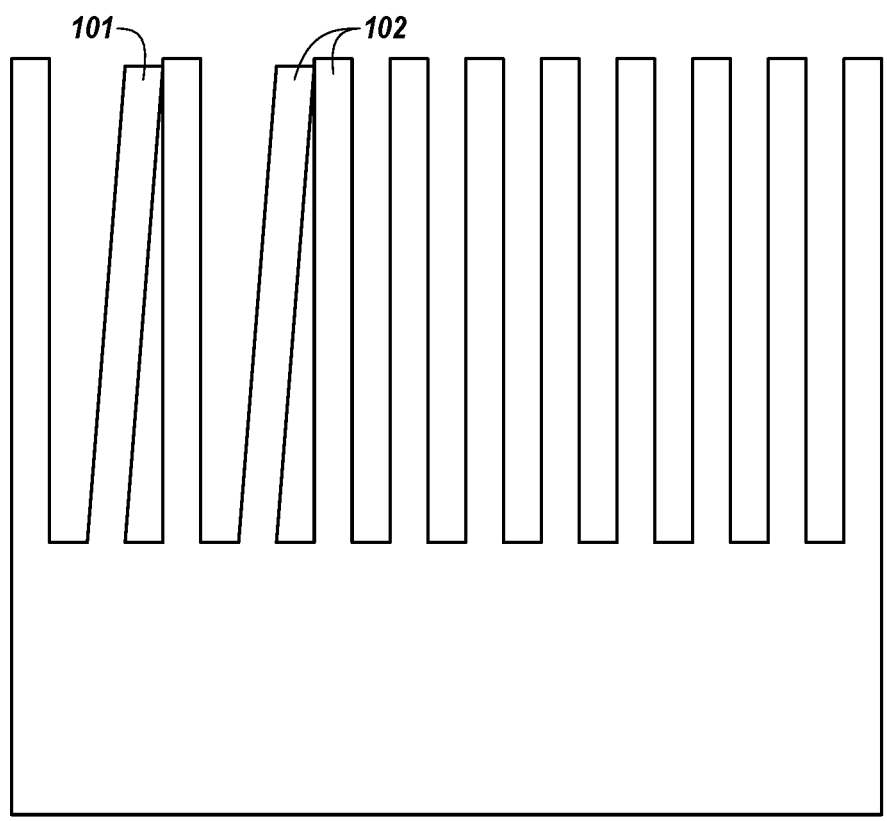
FIG. 1 presents various examples of feature toppling.

The silicon structures can be exposed to moisture during a wet clean process and/or while being moved from tool to tool during fabrication. For instance, features of the silicon structure can be exposed to water and/or water vapor from the air can condense on surfaces of structures (e.g., forming liquid condensate). This can be a problem for structures having small openings between features, such as HAR features. For example, the liquid condensate may form in the openings between the features. High surface tension forces may result from the liquid in the openings that can cause the features to topple (e.g., collapse) toward each other, bringing adjacent features into contact with each other. For example, FIG. 1 illustrates a feature 101 toppling (e.g., collapsing) into an adjacent feature and a pair of adjacent features 102 toppling into each other (e.g. in what is sometimes referred to as bridging). This can lead to defects in the semiconductor device structure, and can even render the semiconductor device inoperable. In a number of embodiments of the present disclosure, a hydrosilylation surface modification process can prevent feature collapse (e.g., sometimes referred to as pattern collapse) by altering the contact angle of liquids on the silicon structure to reduce capillary pressure between features and/or reduce stiction between features of a silicon structure.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions.

The figures herein follow a numbering convention in which the first digit or digits correspond to the drawing figure number and the remaining digits identify an element or component in the drawing. Similar elements or components between different figures may be identified by the use of similar digits. For example, 211 may reference element "11" in FIG. 2A, and a similar element may be referenced as 211 in FIG. 2B. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

Figure 2A:
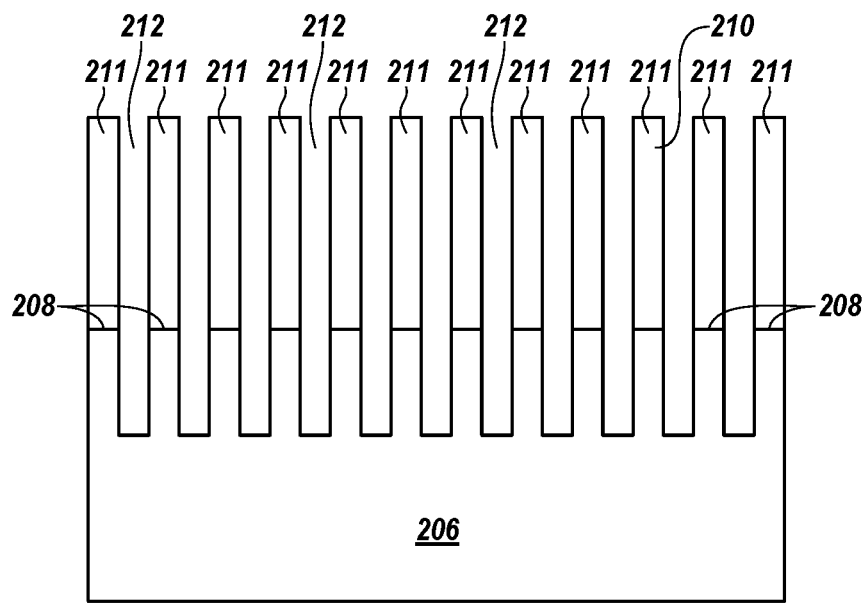
FIGS. 2A-2C illustrate cross-sectional views of processing steps associated with forming a semiconductor device, in accordance with a number of embodiments of the present disclosure.
Figure 2B:
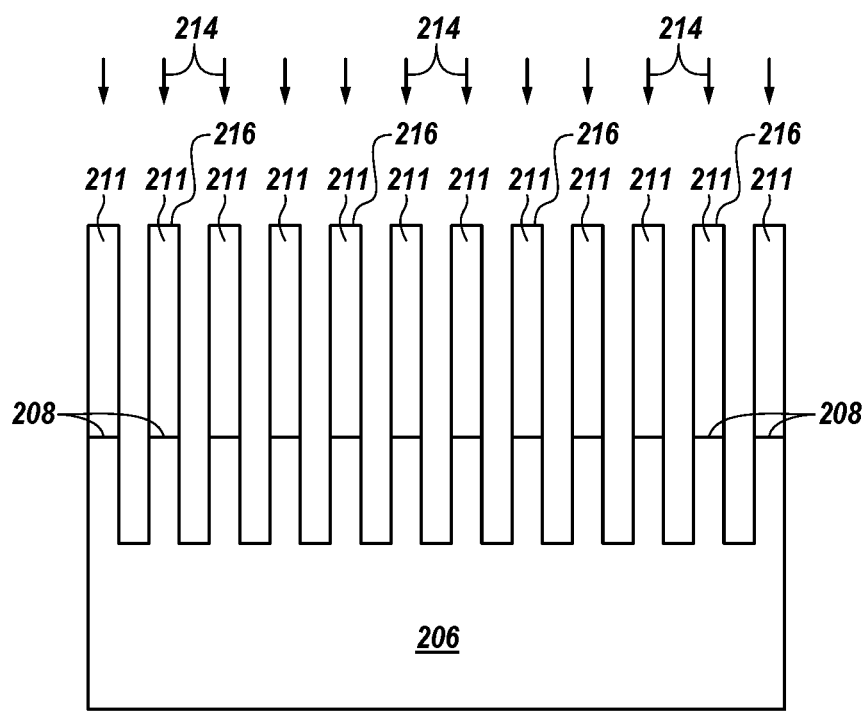
Figure 2C:
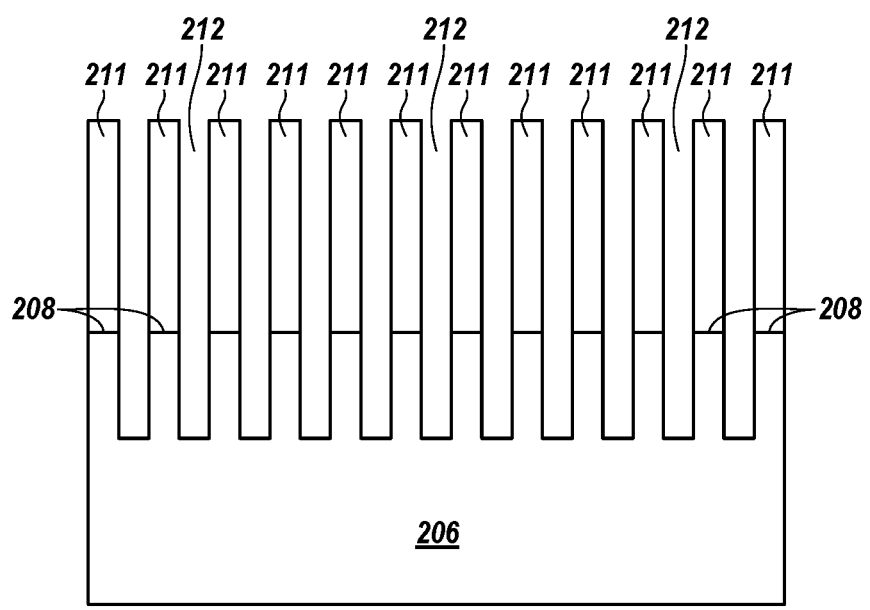

FIGS. 2A-2C illustrate cross-sectional views of processing steps associated with forming a semiconductor device, such as a portion of an integrated circuit, a memory device, a MEMS, among others, in accordance with a number of embodiments of the present disclosure. For example, the processing steps may be associated with forming (e.g., a memory array of) a DRAM memory device, a NAND flash memory device, a NOR flash memory device, among others.

FIG. 2A depicts a structure (e.g., to be used in a semiconductor device) after several processing steps have occurred. The structure may include a base structure, such as a substrate 206 (e.g., a semiconductor). In some examples, one or more materials 210, such as silicon-based materials, may be formed on (e.g., over) a surface 208, such as an upper surface, of semiconductor 206, using, for example, a deposition process, such as PVD, CVD, ALD, electrochemical deposition and/or molecular beam epitaxy, among others.

Features 211, such as microfeatures (e.g., having a width or diameter of about 0.1 micrometer to about 100 micrometer) and/or nanofeatures (e.g., having a width or diameter of about 0.1 nanometer to about 100 nanometer) are formed by removing portions of the structure, such as portions of the one or more materials 210 and portions of semiconductor 206. The removal process forms openings 212, such as spaces (e.g., trenches), through the one or more materials 210, stopping on or in (e.g., as shown in FIG. 2A) semiconductor 206. For example, an opening 212 may be between adjacent features 211. In some examples, each of the respective features 211 includes the one or more materials 210 and a portion of semiconductor 206.

In some examples, portions of the openings 212 in semiconductor 206 (e.g., below surface 208) may correspond to isolation regions, such as shallow trench isolation (STI) regions and/or high aspect ratio features such as those used while forming capacitors, transistors, and other electrical components. In an example, a feature 211 may be entirely of semiconductor 206, and openings 212 may correspond to STI regions. Features 211 may be HAR features, and openings 212 may be HAR openings. For example, an HAR may have a height to width or diameter ratio of 10 to 1, 25 to 1, or greater.

In some examples, openings 212, and thus the structure in FIG. 2A, may be formed using a dry processing tool (not shown), such as the dry removal tool (e.g., dry etch tool), using a dry removal process, such as a dry etch. A mask (not shown), such as imaging resist (e.g., photo-resist), may be formed over the one or more materials 210 and patterned to expose regions of the one or more materials 210. The exposed regions may be subsequently removed, such as by the dry etch process, to form openings 212 that may terminate on or in semiconductor 206.

The residual material from the dry-etch process, can be removed from the structure of FIG. 2A via the wet cleaning tool (e.g., as part of the wet cleaning process) to clean the openings 212 between features 211. In an example, the wet cleaning process may be performed in an inert atmosphere so that the structure of FIG. 2A in not exposed to a reactive gas (e.g., 02).

In some examples, the wet cleaning may include an aqueous wet clean that may include hydrofluoric acid (HF). In an example, an aqueous wet clean may include a standard clean-1 (SC-1) (e.g. for removing organics, particles, and films) that may include deionized (DI) water, aqueous ammonium hydroxide, and aqueous hydrogen peroxide. In some instances, a standard clean-2 (SC-2) (e.g., for removing metal ions) that may include deionized (DI) water, aqueous hydrochloric acid, and aqueous hydrogen peroxide may be performed after SC-1 as part of the aqueous wet clean. The wet-cleaning process may further include the aqueous wet clean with a DI water rinse, followed by a solvent (e.g., isopropyl (IPA)) rinse, followed by drying, such as spin drying, to form the structure of 2A.

As shown in FIG. 2B, a hydrosilylation surface modification process can be performed on the structure of 2A following the wet clean process. The surface modification process can reduce feature collapse and stiction between features 211. A silicon hydrogen (Si—H) and/or silicon fluorine (Si—F) terminated surface of the structure can be formed by exposing the structure to a HF containing solution (e.g., 0.1% to 49% HF or $NH_4F$). The HF containing solution can be applied to the structure using a single-wafer spin clean tool.

The HF containing solution can be removed via DI water rinse and the DI water can be exchanged with a solvent, such as IPA, for example. The structure can be moved to another chamber for further processing while being protected by a solvent puddle.

The hydrosilylation surface modification process can continue by displacing the solvent with the surface modification chemistry 214. The surface modification chemistry 214 can include an alkene and/or alkyne and can be applied to the Si—H and/or Si—F terminated surface of the structure. The surface modification chemistry 214 can be applied neat and/or diluted with a hydrocarbon solvent. The surface modification chemistry 214 can include a branched or unbranched terminal alkene with 5 to 20 carbon atoms (e.g., 1-pentene and/or 1-eicosene), a branched or unbranched terminal alkyne with 5 to 15 carbon atoms (e.g., 1-pentyne and/or 1-pentadecyne), a branched or unbranched terminal alkene with 5 to 20 carbon atoms (e.g., 1-pentene and/or 1-eicosene), compounds containing a vinylbenzene group (e.g., styrene), compounds containing an ethynylbenzene group (e.g., 1-ethynyl-4-pentylbenzene and/or 4-tertbutyl-phenylacetylene), compounds containing a vinyl or ethynyl group and a silyl group (e.g., ethynyltrimethysilane and/or vinyltrimethylsilane), and/or compounds containing a fluorocarbon and a vinyl group (e.g., 1H, 1H, 2H-perfluoro-1-octene), among others.

After exposing the structure having the terminated the Si—H and/or Si—F surface to the surface modification chemistry 214, the structure can be heated to approximately 100° C. to 300° C. The pressure in the chamber can be regulated to control evaporation of the surface modification chemistry 214 and/or the solvent. Once the surface modification is complete, the excess surface modification chemistry and/or solvent can be removed via evaporation (e.g., spin-off and/or venting the chamber to atmospheric pressure).

As shown in FIG. 2C, the surface modification agent can be removed via a dry plasma strip process. The structure in FIG. 2C can include features 211 that were formed and cleaned via a wet clean process followed by the hydrosilylation surface modification process to reduce feature collapse and stiction while drying the structure. The structure in FIG. 2C is ready for further processing steps.

Figure 3:
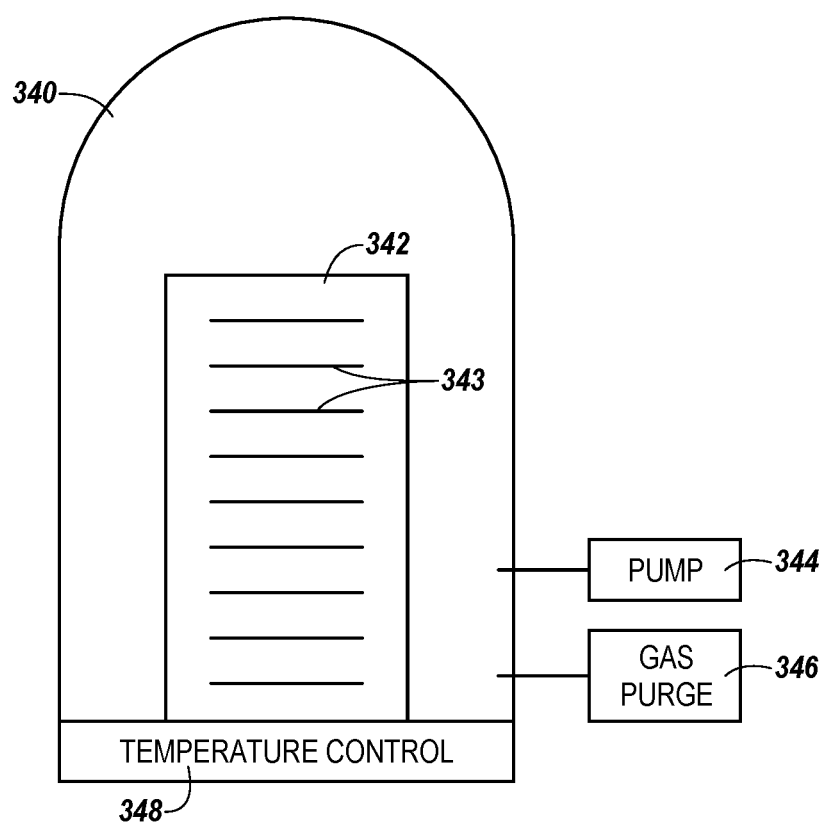
FIG. 3 is a block diagram illustration of a processing apparatus used in conjunction with the processing steps associated with forming a semiconductor device, in accordance with a number of embodiments of the present disclosure.

FIG. 3 is a block diagram illustration of a processing apparatus used in conjunction with the processing steps associated with forming a semiconductor device, in accordance with a number of embodiments of the present disclosure. The processing apparatus can include a chamber 340 to perform hydrosilylation surface modification process and/or form solid sacrificial material in openings of structures, a carrier 342 can hold a batch of semiconductor wafers 343, and tools, for example a pump 344, a gas purge 346, and a temperature control 348, can remove solid sacrificial material via sublimation. A fabrication system can include a number of chambers (e.g., a number of chamber 340) each configured to perform particular processes (e.g., a wet etch process, a dry etch process, and/or a deposition process, among others) during a fabrication.

A hydrosilylation surface modification process can be performed on the structure of 2A in chamber 340. A silicon hydrogen (Si—H) and/or silicon fluorine (Si—F) terminated surface of the structure of wafer 443 can be formed by exposing the structure to a HF containing solution (e.g., 0.1% to 49% HF or NH$_4$F). The HF containing solution can be applied to the structure using a single-wafer spin clean tool in chamber 340

The HF containing solution can be removed via DI water rinse and the DI water can be exchanged with a solvent, such as IPA, for example. The structure can be moved to another chamber for further processing while being protected by a solvent puddle.

The hydrosilylation surface modification process can continue by displacing the solvent with the surface modification chemistry. The surface modification chemistry can include an alkene and/or alkyne and can be applied to the Si—H and/or Si—F terminated surface of the structure.

After exposing the structure having the terminated the Si—H and/or Si—F surface to the surface modification chemistry, the structure can be heated to approximately 100° C. to 300° C. via temperature control 348. The pressure in the chamber can be regulated to control evaporation of the surface modification chemistry 214 and/or the solvent via pump 344. Once the surface modification is complete, the excess surface modification chemistry and/or solvent can be removed via evaporation (e.g., spin-off and/or venting the chamber to atmospheric pressure) via gas purge 346.

Figure 4:
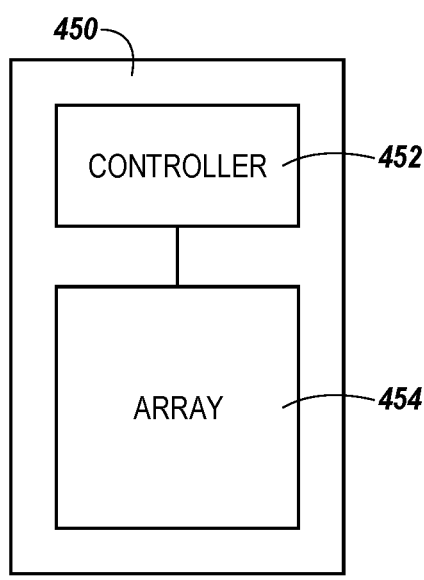
FIG. 4 is a block diagram illustration of an apparatus formed, at least in part, in accordance with a number of embodiments of the present disclosure.

FIG. 4 is a block diagram of an apparatus, such as a memory device 450. For example, memory device 450 may be a volatile memory device, such as a DRAM, a non-volatile memory device, such as NAND flash or NOR flash, among others. For example, memory device 450 may be formed, at least in part, using the processing previously described, such as in conjunction with FIGS. 2A-2C.

Memory device 450 includes a controller 452, such as an application specific integrated circuit (ASIC), coupled to a memory array 454, such as a DRAM array, a NAND array, a NOR array, among others. For example, memory array 454 might be formed, at least in part, according to the processing described previously.

The controller 452 can control the operations on the memory device 450, and of the memory array 454, including data sensing (e.g., reading) and data programming (e.g., writing), for example. Memory device 450 may be coupled to a host device (not shown in FIG. 4).

Embodiments of the present disclosure provide technical advantages, such as reducing the likelihood of feature collapse (e.g. toppling) and stiction between features during processing compared to previous approaches. For instance, a number of embodiments perform a hydrosilylation surface modification process, that acts to prevent feature collapse (e.g., sometimes referred to as pattern collapse) by altering the contact angle of liquids on the silicon structure to reduce capillary pressure between features and/or reduce stiction between features.

Although specific examples have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method for forming a semiconductor device, comprising:
    exposing a silicon structure having at least one feature having an aspect ratio of height to width of at least 10 to 1 to a hydrogen fluoride (HF) containing solution;
    removing the HF containing solution via a deionized (DI) water rinse; and
    performing a surface modification via hydrosilylation by exposing the silicon structure to at least one of an alkene and an alkyne.

2. The method of claim 1, wherein performing the surface modification prevents collapse of patterned features of the silicon structure formed by exposing the silicon structure to the HF containing solution.

3. The method of claim 1, wherein performing the surface modification reduces stiction between patterned features of the silicon structure formed by exposing the silicon structure to the HF containing solution.

4. The method of claim 1, further comprising applying a solvent on the silicon structure prior to performing the surface modification.

5. The method of claim 1, further comprising removing at least a portion of the alkene or the alkyne via evaporation after performing the surface modification.

6. The method of claim 1, further comprising removing at least a portion of the alkene or the alkyne via a plasma strip process after performing the surface modification.

7. A method for forming a semiconductor device, comprising:
performing a surface modification on a Si—H terminated surface of a silicon structure having at least one feature having an aspect ratio of height to width of at least 10 to 1 via hydrosilylation by:
applying a solvent to the Si—H terminated surface; and
reacting at least one of an alkene and an alkyne with the silicon structure.

8. The method of claim 7, further comprising reacting an alkene having between 5 and 20 carbon atom with the silicon structure.

9. The method of claim 7, further comprising reacting an alkyne having between 5 and 15 carbon atom with the silicon structure.

10. The method of claim 7, further comprising reacting a vinylbenzene compound with the silicon structure.

11. The method of claim 7, further comprising reacting an ethnynylbenzene compound with the silicon structure.

12. The method of claim 7, further comprising reacting a compound including a vinyl and a silyl with the silicon structure.

13. The method of claim 7, further comprising reacting a compound including an ethynyl and a silyl with the silicon structure.

14. The method of claim 7, further comprising reacting a compound including a fluorocarbon and a vinyl with the silicon structure.

15. A semiconductor processing system, comprising:
a first chamber configured to:
expose a silicon structure having at least one feature having an aspect ratio of height to width of at least 10 to 1 to a hydrogen fluoride (HF) containing solution; and
perform a wet clean operation on the silicon structure, wherein the wet clean operation removes materials that remain on the silicon structure, including the HF containing solution, after forming patterned features on the silicon structure; and
a second chamber configured to perform a surface modification of the silicon structure via hydrosilylation by exposing the silicon structure to at least one of an alkene and an alkyne.

16. The system of claim 15, wherein the second chamber is configured to heat the silicon structure to a temperature in a range of approximately 100° C. to approximately 300° C.

17. The system of claim 15, wherein the first chamber is configured to apply a solvent to the silicon structure subsequent to the wet clean operation.

18. The system of claim 15, wherein the second chamber is configured to increase pressure within the second chamber during the surface modification.

19. The system of claim 15, wherein the second chamber is configured to, in response to completing the surface modification, remove the alkene or the alkyne by reducing the pressure within the second chamber.

20. The system of claim 15, wherein the first chamber is configured to remove the HF containing solution from the silicon structure with a deionized (DI) water rinse.

* * * * *